(12) United States Patent
Agazzi

(10) Patent No.: US 7,983,569 B2
(45) Date of Patent: Jul. 19, 2011

(54) HIGH-SPEED TRANSMISSION SYSTEM FOR OPTICAL CHANNELS

(75) Inventor: Oscar E. Agazzi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 2299 days.

(21) Appl. No.: 09/765,014

(22) Filed: Jan. 17, 2001

(65) Prior Publication Data

US 2001/0035997 A1 Nov. 1, 2001

Related U.S. Application Data

(60) Provisional application No. 60/177,034, filed on Jan. 17, 2000.

(51) Int. Cl.
*H04B 10/04* (2006.01)
(52) U.S. Cl. .................. 398/183; 398/186; 398/189
(58) Field of Classification Search ............. 398/183, 398/186, 189
See application file for complete search history.

(56) References Cited

U.S. PATENT DOCUMENTS

| 5,291,520 | A  | * | 3/1994  | Cole ........................... 375/254 |
| 5,854,812 | A  |   | 12/1998 | Huber et al. ................. 375/296 |
| 6,385,255 | B1 | * | 5/2002  | McLaughlin et al. ........ 375/263 |
| 6,400,761 | B1 | * | 6/2002  | Smee et al. .................. 375/232 |
| 6,529,303 | B1 | * | 3/2003  | Rowan et al. .................. 398/82 |

FOREIGN PATENT DOCUMENTS

| DE | 44 40 947 | 4/1996 |
| EP | 0 675 622 | 10/1995 |
| WO | 98/39871  | 9/1998 |

OTHER PUBLICATIONS

Fischer, R.F.H. et al. "Dynamics limited precoding, shaping, and blind equalization for fast digital transmission over twisted pair lines." IEEE Journal on Selected Areas in Communications, vol. 13, No. 9, Dec. 1995: 1622-1633.*
Agazzi, O., N. Seshadri, and G. Ungerboeck. "10Gb/s PMD Using PAM-5 Trellis Coded Modulation." IEEE 802.3ae 10Gb/s Task Force. Mar. 2000 Plenary week meeting. Mar. 7-8, 2000. <http://grouper.ieee.org/groups/802/3/ae/public/mar00/>.*
Lee, L.H. Charles. Convolutional Coding: Fundamentals and Applications. Boston, Massachusetts: Artech House, Inc., 1997.*
Schlegl, Christian. Trellis Coding. New York, New York: The Insititute of Electrical and Electronics Engineers, Inc., 1997.*
Ungerboeck, G. "Channel coding with multilevel/phase signals." IEEE Transactions on Information Theory, vol. 28, No. 1. Jan. 1982: 55-67.*
Aman, A.K. et al. "Combined trellis coding and DFE through Tomlinson precoding." IEEE Journal on Selected Areas in Communications, vol. 9, No. 6, Aug. 1991: 876-884.*

(Continued)

*Primary Examiner* — Leslie Pascal
(74) *Attorney, Agent, or Firm* — McAndrews, Held & Malloy, Ltd.

(57) ABSTRACT

A method and apparatus for transmission of data on bandwidth limited fiber optic channels. A multilevel signaling alphabet having multiple levels of optical intensity are used to transmit signals on optical channels. In order to counteract the decrease in signal to noise ratio resulting from the use of a multilevel signaling alphabet over a bilevel signaling alphabet trellis encoding of the data to be transmitted is employed. To counteract intersymbol interference due to signaling faster than the Nyquist Rate, equalization methods such as Tomlinson-Harashima precoding and decision feedback equalization are employed.

62 Claims, 15 Drawing Sheets

OTHER PUBLICATIONS

Sklar, B. Digital Communications: Fundamentals and Applications. Englewood Cliff, New Jersey: P T R Prentice Hall, 1988.*

Uyematsu, et al.—Trellis Coded Modulation for Multilevel Photon Communication System, Singapore ICCS/ISITA 1992, pp. 582-587.

Chiang, et al.—Using Precoding Technique to Reduce the BER Penalty of an M-QAM Channel in Hybrid, AM-VSB/M-QAM Subcarrier Multiplexed Lightwave Systems, IEEE Phontonics Technology Letters, vol. 10 No. 8, Aug. 1998, pp. 1177-1179.

B. L. Kasper, Equalization of Multimode Optical Fiber Systems, The Bell System Technical Journal, vol. 61, No. 7, Sep. 1982, pp. 1367-1388.

Jack H. Winters, et al., Electrical Signal Processing Techniques in Long-Haul Fiber-Optic Systems, IEEE Transactions on Communications, vol. 38, No. 9, Sep. 1990, pp. 1439-1453.

S. Walklin and J. Conradi, "Multilevel Signaling for Increasing the Reach of 10Gb/s Lightwave Systems," Journal of Lightwave Technology, vol. 17, No. 11, Nov. 1999, pp. 2235-2248.

Guizani and A.R. Al-Ali, "PC-Compatible Optical Data Acquisition Unit," 1994 Instrumentation and Measurement Technology Conference, May 10-12, 1994.

N. Kanno and K. Ito, "Fiber-Optic Subcarrier Multiplexing video Transport Employing Multilevel QAM," IEEE Journal on Selected Areas in Communications, vol. 8, No. 7, Sep. 1990.

W. Ellersick, C.K. Yang, M. Horowitz, and W. Dally, "GAD: A 12GS/s CMOS 4-bit A/D Converter for an Equalized Multi-Level Link," 1999 Symposium on VLSI Circuits.

W.J. Dally and J. Poulton, "Transmitter Equalization for 4Gb/s Signalling," Proceedings of Hot Interconnects IV, Palo Alto, 1996.

J.H. Winters, R.D. Gitlin, and S. Kasturia, "Reducing the Effects of Transmission Impairments in Digital Fiber Optic Systems," IEEE Communications Magazine, Jun. 1993, pp. 68-76.

S. Kasturia and J.H. Winters, "Techniques for High-Speed Implementation of Nonlinear Cancellation," IEEE Journal on Selected Areas in Communications, vol. 9, No. 5, Jun. 1991.

B.L. Kasper, "Equalization of Multimode Optical Fiber Systems," Bell System Technical Journal, vol. 61, No. 7, Sep. 1982, pp. 1367.

J.H. Winters and R.D. Gitlin, "Electrical Signal Processing Techniques in Long-Haul Fiber-Optic Systems," IEEE Transactions on Communications, vol. 38, No. 9, Sep. 1990, pp. 1439-1453.

R. Mason and J.T. Taylor, "High-Speed Electro-Optic Analogue to Digital Converters," 1993 International Symposium on Circuits and Systems, May 3-6, 1993.

T.E. Darcie, "Subcarrier Multiplexing for Lightwave Networks and Video Distribution Systems," IEEE Journal on Selected Areas in Communications, vol. 8, No. 7, Sep. 1990.

J.A.C. Bingham,"Multicarrier Modulation for Data Transmission: An Idea Whose time Has Come," IEEE Communications Magazine, May 1990, pp. 5-14.

R. Olshansky, V.A. Lanzisera, P.M. Hill, "Subcarrier Multiplexed Lightwave Systems for Broadband Distribution," Journal of Lightwave Technology, vol. 7, No. 9, Sep. 1989.

* cited by examiner

TOMLINSON-HARASHIMA PRECODING (THP)
(a) PRECODER WHERE COMPENSATION SYMBOL $v_n$ IS EXPLICITLY ADDED
(b) PRECODER WHERE COMPENSATION SYMBOL $v_n$ IS GENERATED BY THE OVERFLOW BLOCK mod(M)

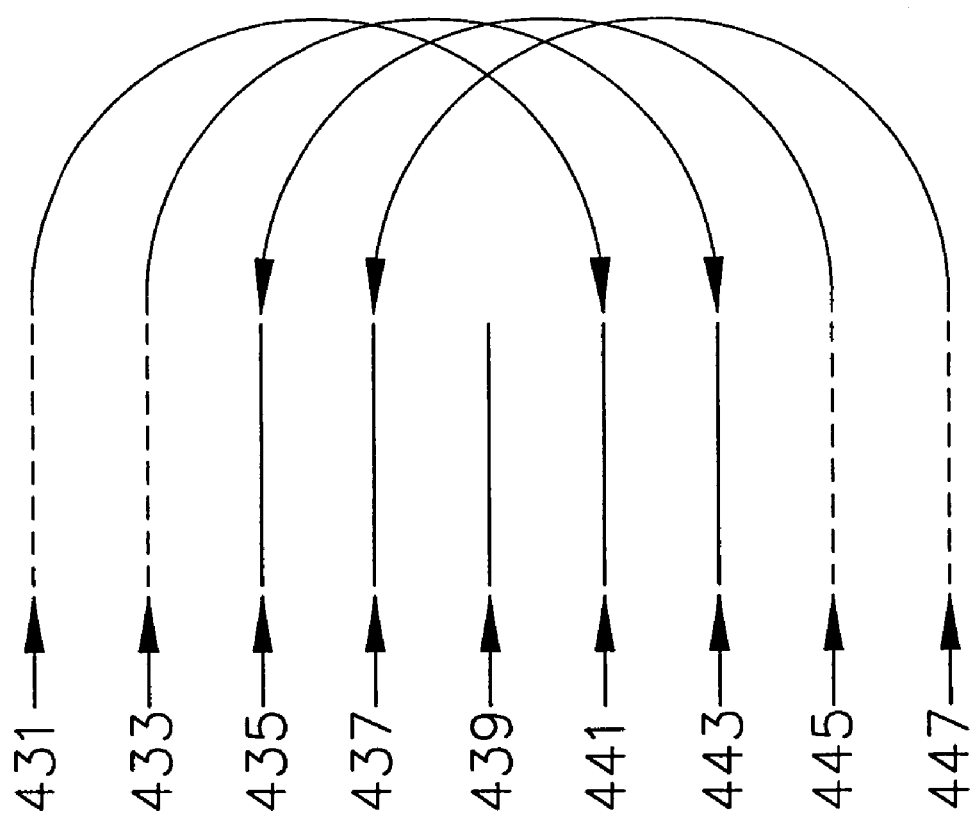

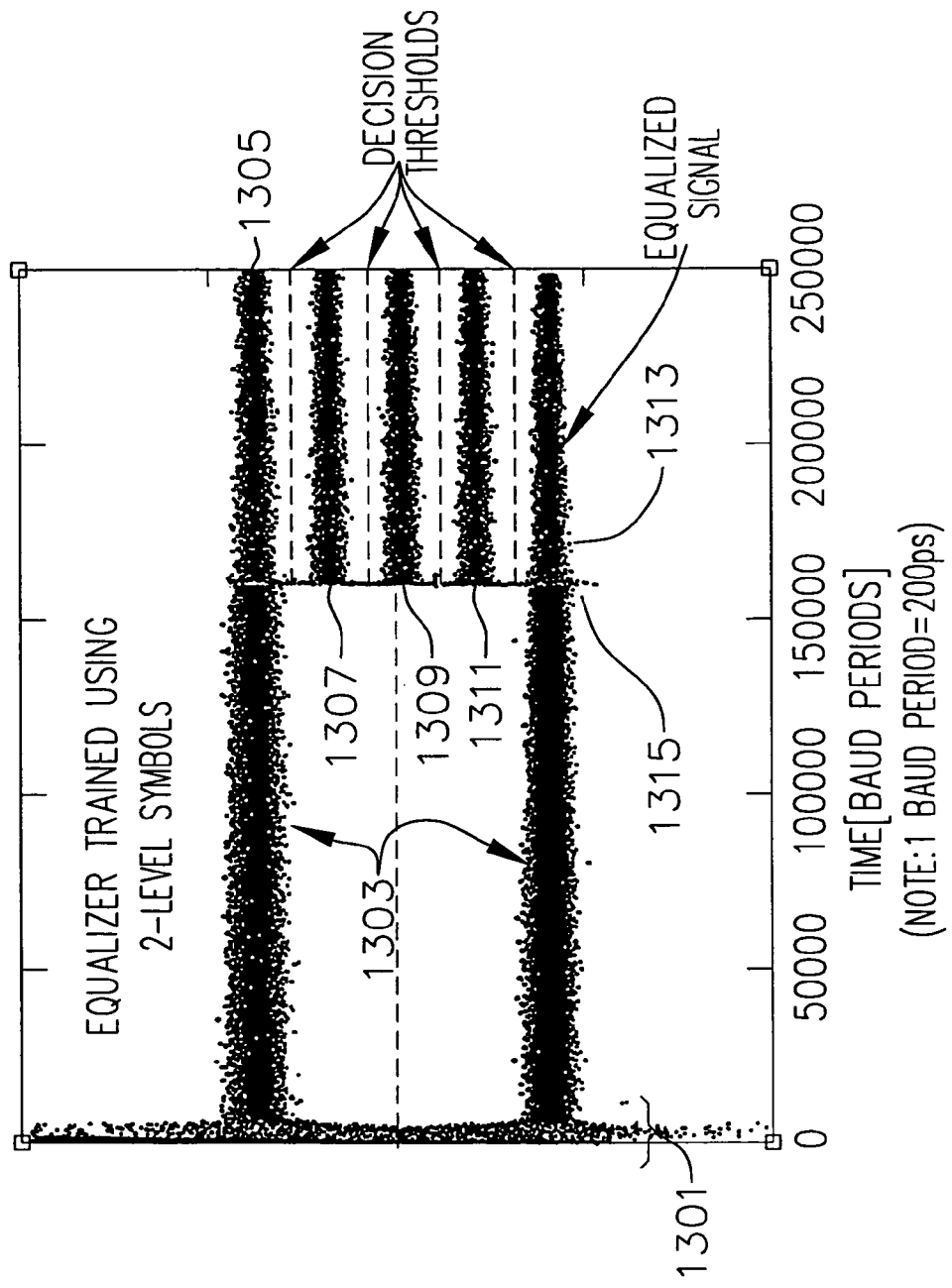

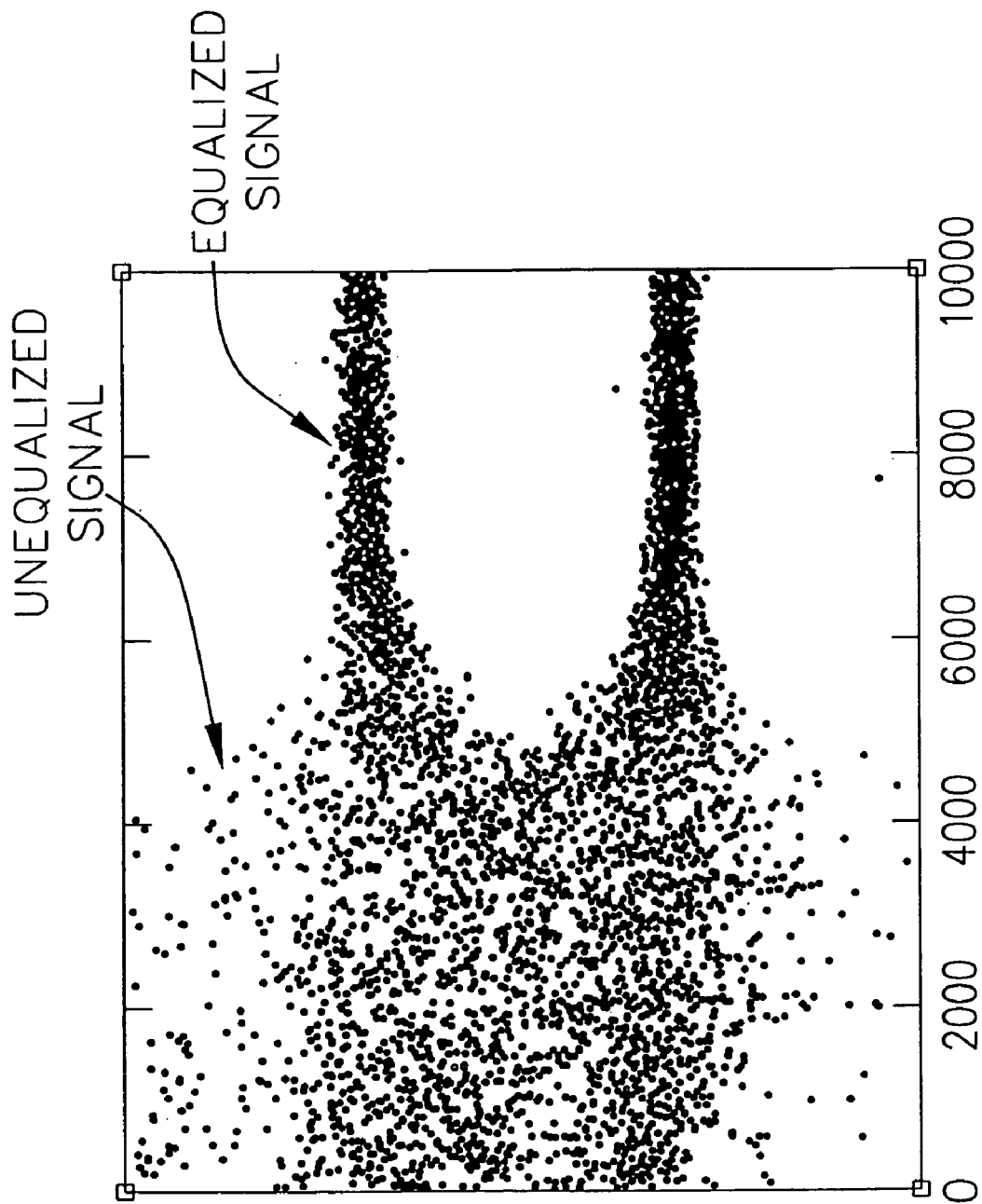

HIGH-SPEED TRANSMISSION SYSTEM FOR OPTICAL CHANNELS

CROSS-REFERENCE TO RELATED APPLICATIONS

This Application claims priority from Provisional Application No. 60/177,034 entitled HIGH SPEED TRANSMISSION FOR OPTICAL CHANNELS filed on Jan. 17, 2000, which is incorporated by reference herein as though set forth in full.

FIELD OF THE INVENTION

The present invention relates generally to apparatus and methods for high speed data transmission over optical channels, and, in particular embodiments, to transmission of data using pulse amplitude modulation, trellis coding, and equalization techniques.

BACKGROUND OF THE INVENTION

The demand for higher capacity data transmission systems continues to increase. To satisfy the ever increasing demand for more data transmission capacity higher baud rate systems such as optical channels have been used. At high baud rates some optical fibers may exhibit phenomena such as multimode transmission characteristics and intersymbol interference, which can limit the signaling rate available on that fiber. Therefore, there is a need within the art for methods and apparatus that are capable of higher baud rates, and for those which can compensate for the problems encountered with high speed data transmission.

SUMMARY OF EMBODIMENTS OF THE INVENTION

In one aspect of the invention, an apparatus for transmitting data on a fiber optic channel is disclosed. The apparatus comprises a trellis encoder that accepts data to be transmitted, applies a convolutional coding to a portion of the data, and produces a trellis coding of the data to be transmitted. A subset mapper accepts the trellis coding and produces a plurality of pulse amplitude modulated (PAM) symbols from the trellis coding. A Tomlinson precoder accepts the PAM symbols and applies a Tomlinson precoding the PAM symbols. A converter converts the PAM symbols into a form for coupling into a fiber channel.

In another aspect of the invention an apparatus for receiving data from a fiber optic channel is disclosed. The apparatus comprises an electrical to optical converter that receives an optical signal and converts the optical signal into an analog signal. A decoder accepts the analog signal and converts it into a digital signal. A decoder then accepts and decodes the digital signal producing data. The decoder may be a trellis decoder, and embodiments may incorporate a decision feedback equalizer.

Additionally methods corresponding to functions performed by the apparatuses may form embodiments of the invention.

BRIEF DESCRIPTION OF THE DRAWINGS

These and other features, aspects, and advantages of the present invention will become better understood with regard to the following description, appended claims, and accompanying drawings where:

FIG. 4a is a graphical illustration of the mapping of excess pulse amplitude modulation levels which are produced by a Tomlinson-Harashima precoder.

FIG. 13 is an eye diagram of a simulated receiver equalizer, illustrating a transition between a bilevel training mode and receiving PAM-5 symbols.

FIG. 14 is a graph of a magnified portion of the graph of FIG. 13, illustrating the convergence of the equalizer during a training sequence.

DETAILED DESCRIPTION OF THE INVENTION

The demand for higher data carrying capacity transmissions systems continues to increase. Accordingly, embodiments of the present invention relate to methods and apparatus for increasing the rate of data transmission in optical transmission systems.

Figure 1:
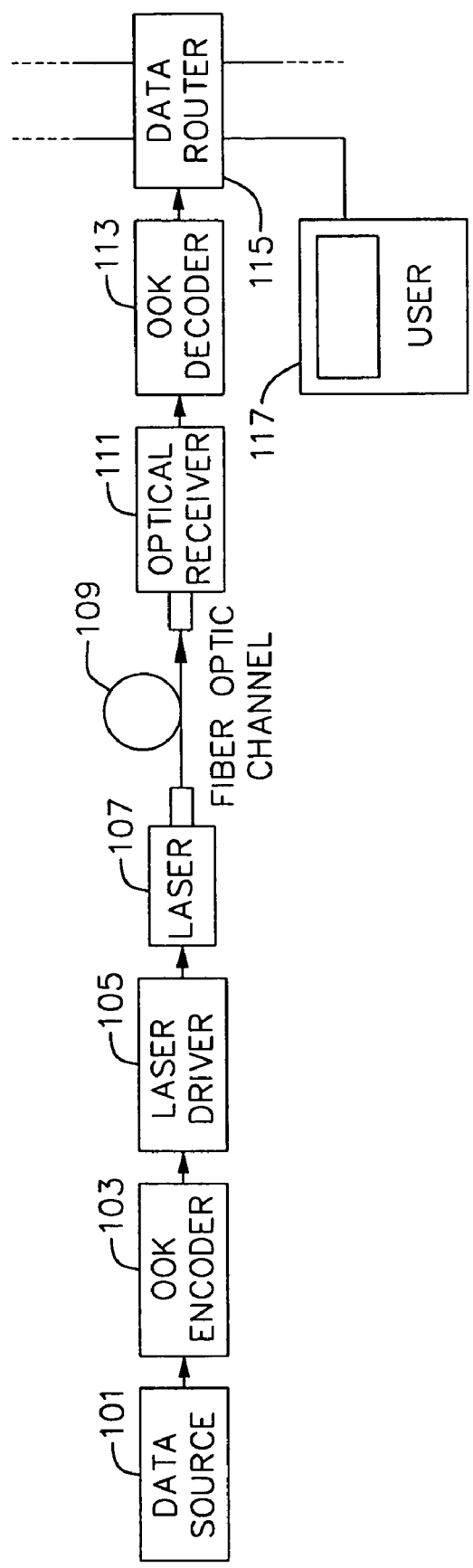
FIG. 1 is a block diagram illustrating components of an optical data communication system.

FIG. 1 is a block diagram illustrating a prior art optical data communication system.

In FIG. 1 a data source 101 provides data to be transmitted over fiberoptic channel 109. Data source 101 may be, for example, the Internet, a cable television head end, a corporate network or a variety of other data sources.

Data from data source 101 is provided to an encoder 103, which encodes the data. Encoding may encompass representing the input data from the data source 101 in a variety of ways. In the exemplary system of FIG. 1 the data encoding comprises translating the data received onto a series of OOK (On Off Keying) symbols for transmission using a laser. OOK represents the data as a series of on-off pulses or two levels of optical intensity.

Once the data is encoded, the encoded signal is coupled into an optical channel driver, such as a laser driver 105, which controls the intensity of a laser 107. The output of laser 107 is coupled into a fiber optic channel 109. The fiber optic channel is further coupled to an optical receiver 111. The optical channel 109 may be of various lengths depending upon the application.

The optical receiver 111 accepts the signal provided by the fiber optic channel 109 and converts it into an electrical signal. The electrical signal, representing the transmitted data, is provided to an OOK data decoder 113. The data decoder 113 reverses the process of the encoder 103 and recreates the data provided by the data source 101. The data from the decoder may be then routed, for example using a data router 115, to various user devices. An exemplary user device 117 then receives data, such as video data, from the data router 115.

Figure 2:
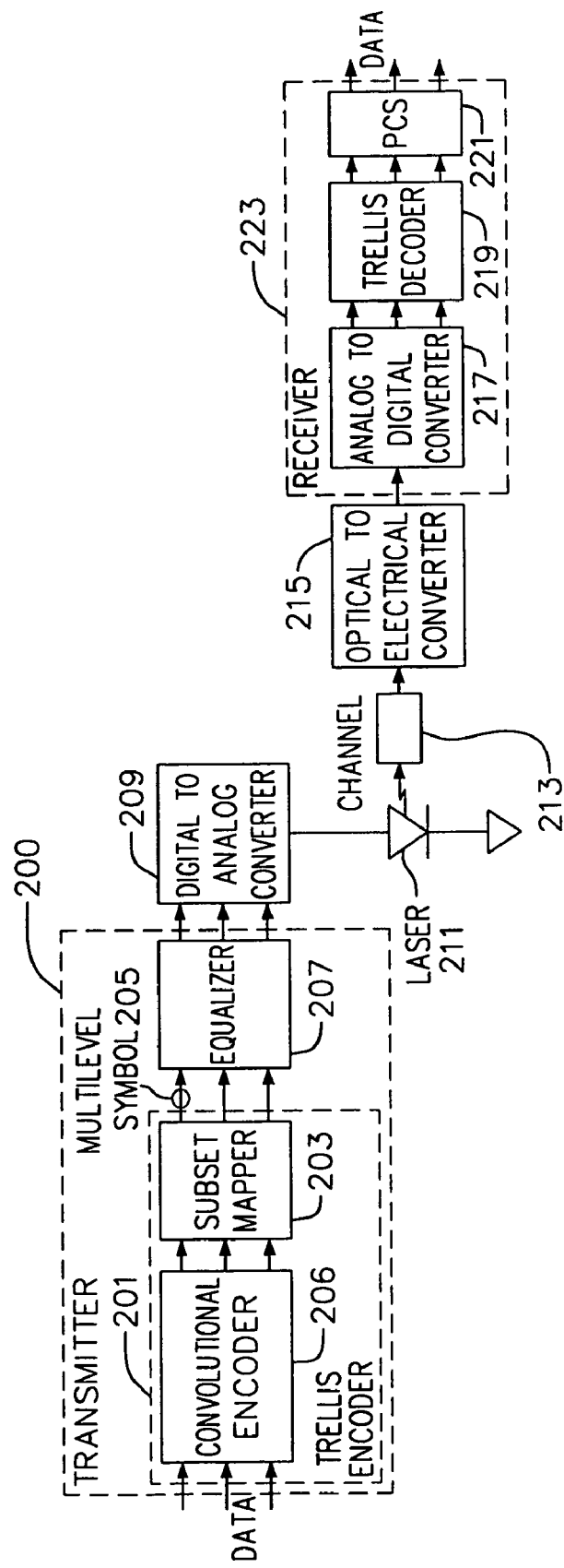
FIG. 2 is a block diagram of a optical communication system according to an embodiment of the invention.

FIG. 2 is a block diagram of an optical communication system according to an embodiment of the invention. Transmitter 200 communicates with receiver 223 over channel 213. In FIG. 2 the data to be encoded is coupled into a trellis encoder 201. The trellis encoder 201 includes convolutional coder 206 and subset mapper 203. The trellis encoder 201 may be a single trellis encoder or it may be a series of trellis encoders in parallel.

The outputs of the convolutional coders 206 are further coupled into subset mappers 203. A subset mapper accepts the convolutionally encoded signal and produces multilevel symbols 205 as an output. The multilevel symbols are then coupled into equalizers 207. The equalizers 207 are used to compensate for the non-flat response of a channel 203. After equalizing the multilevel symbols, the equalizers provide the resultant symbols to one or more digital to analog converters (D/A) 209. The digital to analog converters 209 accept the equalized multilevel symbols, and convert them into analog signals. The analog signals are then coupled serially into an optical source such as a laser 211. The digital to analog (D/A) converter(s) provide successive signals to laser 211 during a second time period, and so forth. In other words a signal from a first D/A converter may be provided to the laser 211 during a first time period, then a signal from a second D/A converter may next be provided to the laser 211. In such a manner multiple symbols from multiple data sources may be transmitted by the single laser 211. Alternatively, a single D/A converter may accept successive values from multiple data sources, converting them into a series of analog values to be used to modulate the intensity of the laser output 211.

The output of the laser 211, modulated by the analog representation of the multilevel symbols, is coupled into the optical channel 213. The optical channel 213 transmits the intensity modulated laser signal to an optical-to-electrical converter 215. The optical-to-electrical converter 215 accepts the optical signal from the channel 213 and converts it back to an intensity modulated series of electrical signals. The optical-to-electrical converter 215 then provides the amplitude-modulated signals to one or more analog-to-digital (A/D) converters 217. The A/D converters converts the series of analog signals to digital signals. The digital signals are provided to one or more trellis decoders 219 where the trellis-encoded digital signals are decoded. The output of the trellis encoders are provided to a physical coding sublayer (PCS) unit 221. A physical coding sublayer (PCS) may provide bit manipulation, such as decoding, to the signals decoded by the trellis decoder 219. The data output of the PCS 221 is then provided to a user interface such as an XGMII (extended Gigabit Media Independent Interface).

Illustratively, the optical communication system depicted in FIG. 2 has particular characteristics. For example, the channel 215 is considered to be a standard 62.5/125 µm fiber. Fiber is commonly specified in terms of a bandwidth times length product. For a 62.5/125µ meter fiber a typical bandwidth times length product is 500 MHz/km. 500 meters of such fiber would typically yield a 1 gigahertz bandwidth for a laser wavelength of 1310 nanometers.

To transmit a signal at or less than the Nyquist rate, the minimum bandwidth must equal one half of the symbol rate of the channel. The Nyquist bandwidth of a channel is the maximum rate at which signaling can occur on that channel without intersymbol interference (ISI). In other words, a system cannot transmit signals faster than the Nyquist rate without intersymbol interference. However, an equalizer such as 207 can be used to remove intersymbol interference. Equalization in FIG. 2 is shown within the transmitter 200. Such equalization is called transmit side equalization. Equivalently, equalization may be applied at the receiver 223. For example, decision feedback equalization (DFE) may be used at the receiver 223. Although the equalization can be done equivalently on the transmitter as well as the receiver side, there are certain advantages to placing the equalizer in the transmit side. For example, if the equalization is placed within the receiving side, the trellis decoder and an equalizer must function concurrently. Concurrent trellis decoding and equalization is a complication within the receiver that can be avoided by having the equalization circuit in the transmitter. It is difficult to combine an equalizer and a trellis decoder, in a receiver, because such a receiver would have to decode the trellis while attempting to compensate for the intersymbol interference. If the equalization is done in the transmitter, there is no necessity to compensate for intersymbol interference while decoding the trellis coding.

Embodiments of the present invention may include, for example, a single trellis encoder, a single symbol mapper, a single equalizer etc. Alternatively, the same components may be replicated multiple times the signals time multiplexed from such parallel components in order to couple them in and out of a single fiber channel. To simplify the disclosure, however, the components will be illustrated as single components. Those skilled in the art will realize that the same components may be used in a variety of parallel configurations.

For the purposes of example, the multilevel symbols 205 are considered to be part of a PAM-5 (pulse amplitude modulation-5 level) alphabet.

Figure 3:
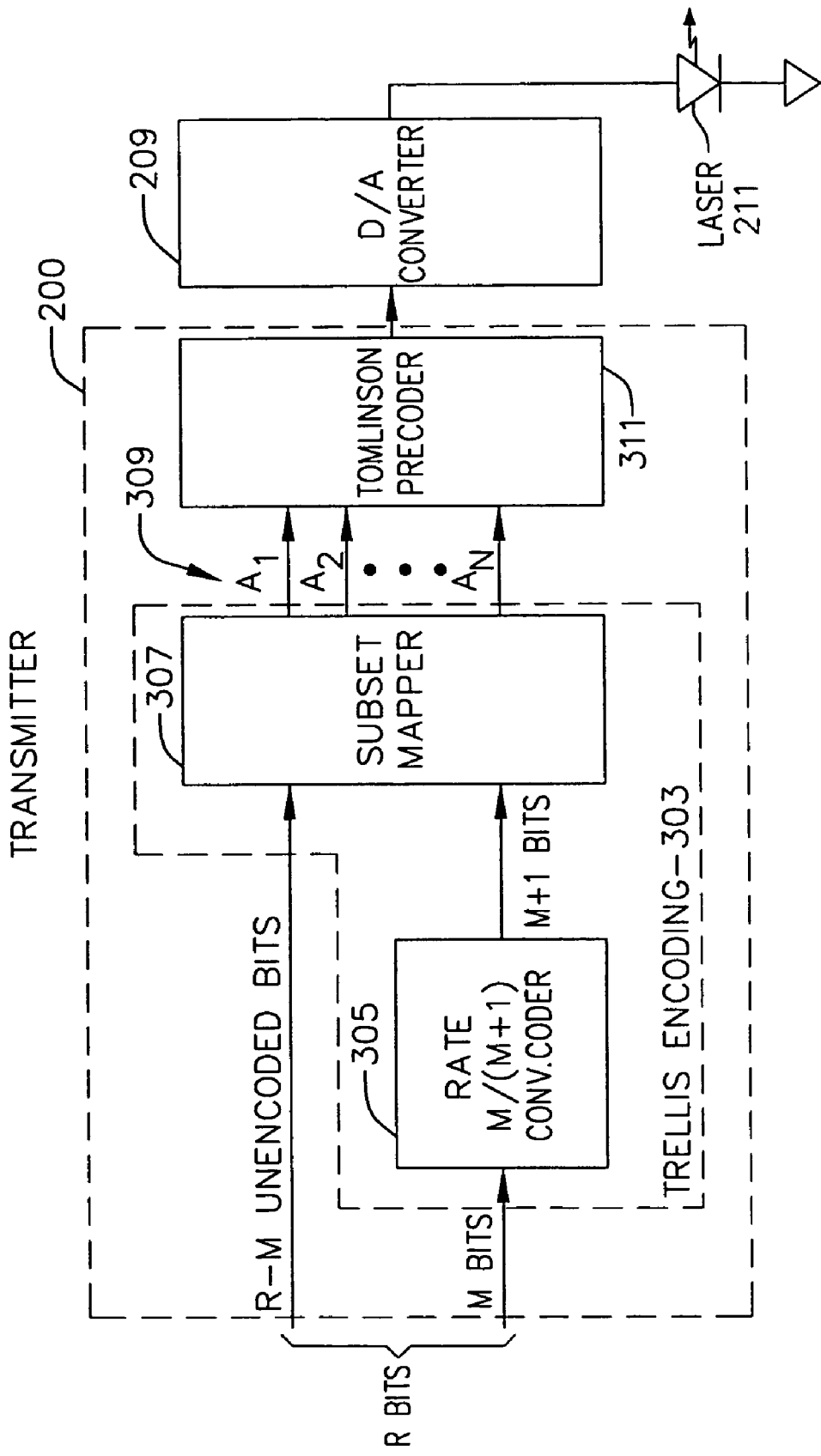
FIG. 3 is a block diagram illustrating a fiber optic transmitter according to an embodiment of the invention.

FIG. 3 is a block diagram illustrating the fiver optic transmitter 200 according to an embodiment of the current invention. Detail of the transmitter 200 is illustrated in FIG. 3. The trellis decoder 303 accepts a group of R bits from a data source (not shown). The convolutional coder 305 is a rate M/(M+1) convolutional coder of M bits out of the R bits which are input to the rate m/(MH) encoder 303. R-M bits will be unencoded and M bits will be encoded. The output of the convolutional coder 305 comprises (M+1) bits. The R-M unencoded bits and the M+1 coded bits, which are output from the convolutional coder 305, are provided to a subset mapper 307. The subset mapper 307 maps the received bits into a series of multilevel symbols 309, for example, PAM 5. The combination of convolutional coder 305 and the R-M unencoded bits comprises a trellis encoder 303. The pulse amplitude modulated signals $A_1$ through $A_N$ have 5 levels, but may have any number of amplitude levels, depending on the pulse amplitude modulation scheme chosen.

The fiber optic channel, as discussed above, illustratively exhibits multimode transmission characteristics at any Nyquist bandwidth of 1 GHZ. Accordingly, the bandwidth available in the channel is smaller than required to signal without intersymbol interference (ISI) at a 10 GHZ rate. To achieve the 10 GHZ signaling rate, the channel operates in the presence of intersymbol interference. One way to compensate for intersymbol interference is to use an equalizer in the receiver. For example, a decision feedback equalizer (DFE) may be used. The DFE is discussed in the receiver section.

A further way to compensate for the effect of intersymbol interference is to use a Tomlinson precoder 311.

In FIG. 3 multilevel symbols 309 are provided to a Tomlinson precoder. The exemplary system illustrated in FIG. 3 is a 10 gigabit per second (Gb/s) transmission system implemented using a five level pulse amplitude modulation-5 level (PAM-5) transmission scheme. The baud rate necessary to achieve a 10 Gb/s transmission is reduced to, five gigabaud because each PAM-5 symbol can represent two bits.

There are multiple advantages to reducing the baud rate by using pulse amplitude modulation. One advantage is that the system can operate over multimode and limited bandwidth channels over greater distances than would be possible if on/off keying (OOK) were used. Another advantage, of using PAM instead of OOK, is that the PAM symbols can represent multiple bits of information. Accordingly, the speed of the electronic circuits needed to create the transmitted signal at the transmitter is reduced. Consequently, the speed of the electric circuits needed at the receiver is also reduced. By reducing the required speed of the electronic circuits, technology such as CMOS (complimentary metal oxide semiconductor) may be used to implement the electronic circuitry. In contrast, high speed electronic circuits can often require expensive high speed technology such as gallium arsenide or indium phosphide. Because of the higher levels of integration presently available using CMOS, a greater level of integration is possible than with such technologies as gallium arsenide or indium phosphide, and so it is advantageous to use PAM symbols to decrease the signaling rate while keeping the baud rate constant.

A potential disadvantage of using multilevel encoding such as PAM-5, instead of the more traditional on/off keying, is that a higher signal to noise ratio (SNR) may be required of the channel since OOK needs to represent only two levels whereas PAM symbols are multiple levels. By using multiple levels the distance between levels is reduced, over using two levels. Because the distance between levels is reduced the available noise margin is also reduced. To reduce the required signal to noise ratio to a level equivalent to the OOK system, PAM-5 modulation may be combined with trellis coding as illustrated in the embodiment of the invention illustrated in FIG. 3.

In FIG. 3 a Tomlinson Harashima (Tomlinson) precoder 311 functions as a transmit side equalizer. A traditional equalizer in a receiver compensates for distortion and uneven frequency response caused by the transmission channel. Including the fiber on laser equalization, however, can be done equivalently in a receiver or a transmitter. In either case the result is a signal characteristic that, when combined with the channel characteristic, ideally results in a flat overall response.

A problem with attempting to equalize a fiber channel is that the fiber may exhibit nulls. In other words, the fiber channel transfer function permits very little signal transmission at a particular frequency. An equalizer, attempting to compensate for such nulls, may require an high gain to make up for the poor response of the channel. High gain may produce an unstable response in the equalizer.

Tomlinson Harashima precoding may be used to compensate for frequency nulls within the channel. The output of the Tomlinson precoder 311 is provided to a Digital Analog (D/A) converter 313. The D/A converter produces an analog signal, which is used to modulate the intensity of the laser 211. The Tomlinson precoder is shown as a simplified representation in 311. The Tomlinson precoder 311 may actually be a group of Tomlinson precoders, each of which operates on one PAM-5 symbol. The PAM-5 symbols thus generated are multiplexed into the D/A converter 313.

Figure 4:
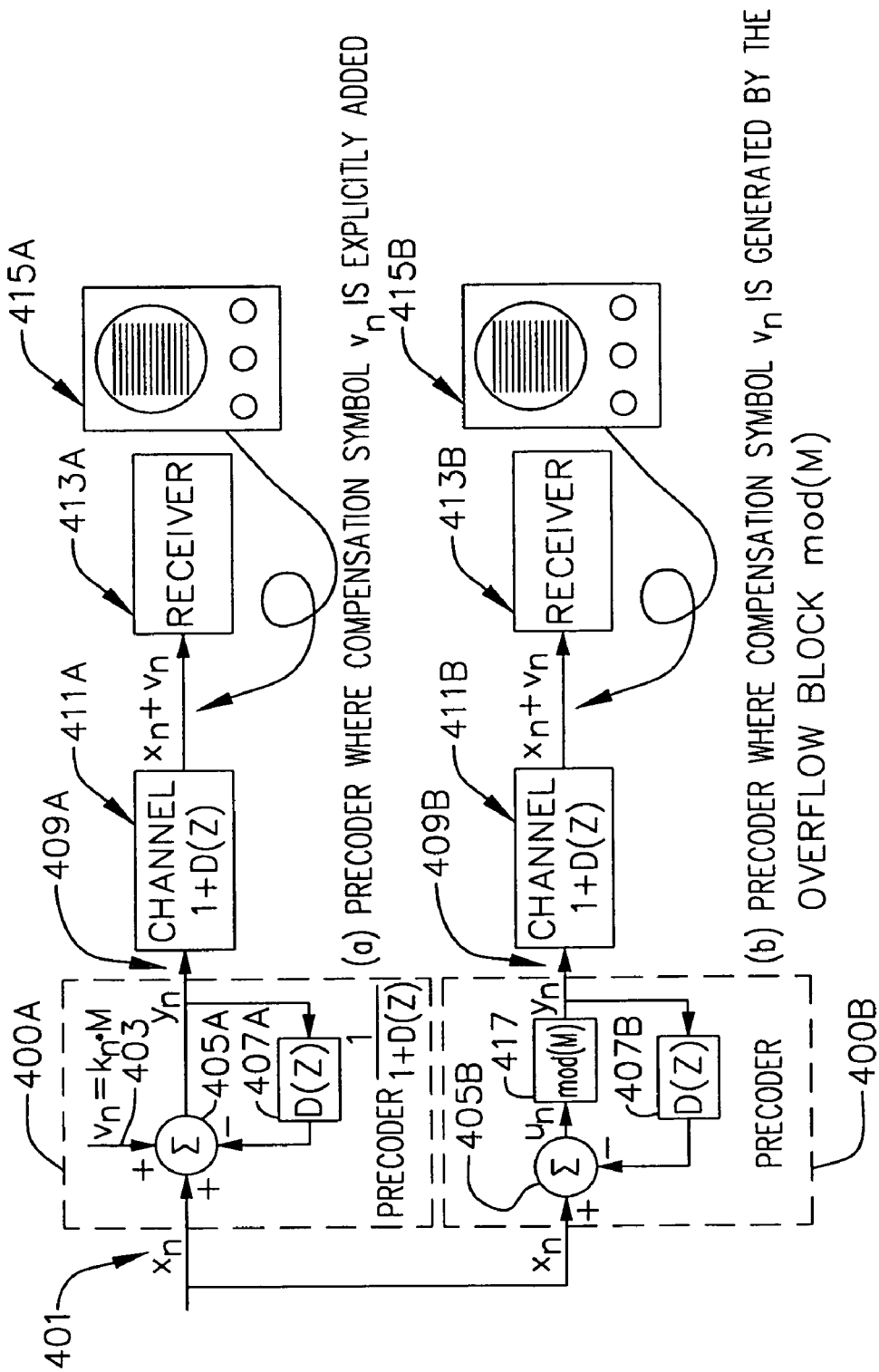
FIG. 4 is a graphical illustration of Tomlinson-Harashima preceding (THP).

FIG. 4 is a graphical illustration of Tomlinson-Harashima precoding (THP). In FIG. 4, Channel 411A, which is identical to Channel 411B, can be described by a Z transform. The characteristics of Channel 411A and 411B can be described by the expression "1+D(Z)." The term "D(Z)" term is responsible for the intersymbol interference exhibited by the channel. If it is desired to compensate for the characteristic of the channel within the transmitter, a filter with a transfer characteristic inverse of the channel must be added. By implementing a feedback loop comprising the summation unit 405A and the feedback filter 407A, a transfer characteristic of $1/(1+D(Z))$ is created. The total response would then be $1/(1+D(Z))$ times $1+D(Z)$ resulting in a net channel characteristic of one, which is the combined response of the precoder and the channel. The combined response of the precoder and the channel is therefore a flat response which does not introduce any dispersion, and therefore, the signal at the receiver 413A is equalized.

Difficulties can be encountered because at frequencies where the channel exhibits significant attenuation, the precoder will require significant gain to compensate for the attenuation. At such frequencies due to the increased gain, the precoder may become unstable. In order to stabilize the precoder and to limit the amplitude of the signal out of the precoder, a signal $V_n$, represented by arrow 403 is added to the summation unit 405A. $V_n = K_n \times M$ where M is the number of levels being transmitted on the channel. In the present PAM=5 embodiment, M has a value of 5. The output signal of the precoder, $V_n$, is computed and if the signal exceeds certain limits then $V_n$ is subtracted from the signal $Y_n$. $K_n$ is the smallest integer that returns the output $Y_n$ back into the desired range. M is essentially the maximum allowable range of the output of the precoder. Depending on the value of $Y_n$ there is a integer value $K_n$ that will bring the output of the precoder back within the range M. This is the basis of Tomlinson Harashima Precoding (THP). In other words, the THP inverse channel characteristic filtering then modifies the input to the summation unit by adding an integral multiple of M (i.e., $V_n$) which makes the output bounded to the input. The output of the channel sees a quantity equal to $X_n$ plus $V_n$. In other words, the number of levels appearing at the receiver has been expanded. Accordingly, the slicer in the receiver must be able to distinguish $X_n + V_n$ levels instead of just being able to distinguish $X_n$ levels. One consequence of such equalization is the increase of the number of levels in the constellation at the receiver. Therefore, to recover the original PAM-5 levels in the receiver a-wrap-around scheme, such that the excess levels are wrapped around into the original PAM-5 levels. Such a wrap around is illustrated in FIG. 4A.

Figure 9:
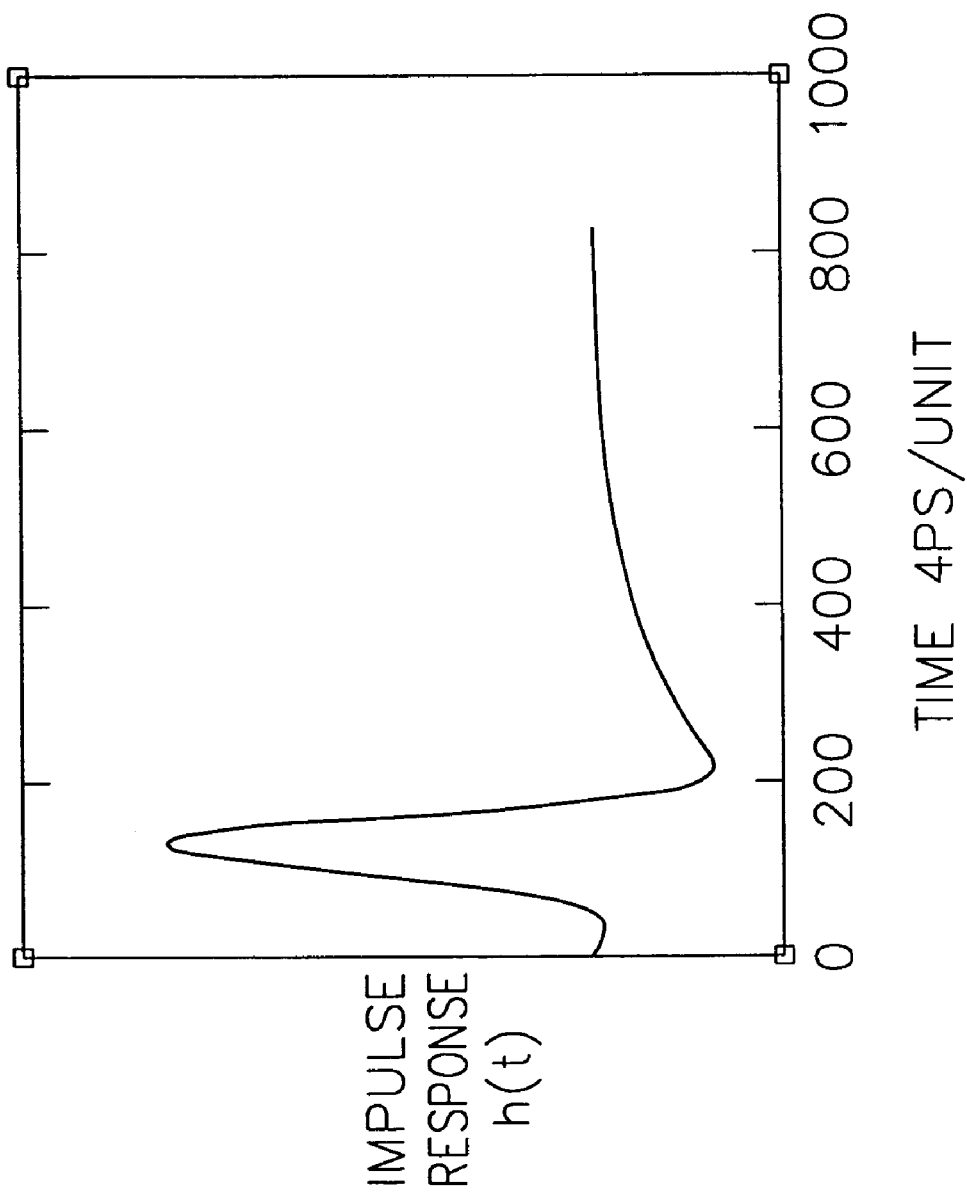
FIG. 9 is a graph representing of the impulse response of a linear system having a Gaussian impulse response.

FIG. 4A is a graphical illustration of the mapping of excess pulse amplitude modulation levels produced by a THP, such as illustrated in FIG. 4. In FIG. 4A, 9 PAM constellation levels are present. The correct PAM-5 levels, that is 435, 437, 439, 441 and 443 are present. In addition, levels 431 and 433 which are higher than the highest PAM level 445, are present. Additionally, levels 445 and 447 are present which are lower than the lowest level 443 are present. In order to map the 9 levels back into the original 5 levels, a modulo type add or subtract is done. In other words, if the level out to be remapped are above the maximum levels, a modulo 5 value is subtracted. In the present case, 5 levels are subtracted from level 433, and accordingly level 433 maps into level 443. Similarly, 5 levels are subtracted from level 431 and level 431 maps into level 441. Similarly level 445, which is below the lowest level of 443, has 5 levels added to it and level 445 is thereby mapped into level 435. Similarly, level 447, which is below the lowest level of 443, has 5 levels added to it and is thereby remapped into level 437. If for example 6 levels were present above level 435 then 10 would be subtracted from the $6^{th}$ level and the $6^{th}$ level above 435 would map into level 443.

Referring to FIG. 4 precoder 400B illustrates an alternate method of adding the correction factor $V_n$ to the precoder. In precoder 400A signal $Y_n$ is examined and then a value for $K_n$ is decided on and the value $V_n$ is then added or subtracted in the summation unit 405A. In reality the operation of creating the adjustment value $V_n$ is nothing more than a wrap around operation. The operation is comparable to the overflow in an accumulator. Therefore, in the precoder represented in 400B modulo block 417 is added. In the modulo M block 417, a wrap around operation is added to the precoder circuit and automatically accomplishes the adjustment accomplished by the summation for the $V_n$ signal in summation block 405A in precoder 400A.

One problem with Tomlinson precoding is that the number of levels in the receiver may grow depending on the channel characteristics. For example, in a PAM-5 system the number of levels may grow to 15, 20 or more. The proliferation of levels in the receiver may be a problem because within the receiver is an A/D converter sampling the multiple received levels. In order to accommodate multiple levels, the resolution of the A/D converter can be adversely impacted because the levels must be scaled so that they fit within the range of the A/D. That is, the resolution of an A/D converter discriminating between 5 levels is much better than the resolution of that same A/D converter discriminating 15 levels. Therefore, adding levels can require a better A/D converter, that is one having more bits of resolution. It is therefore desirable to limit the number of levels presented to the receiver. The number of levels that are presented to the receiver can be accomplished by limiting the value of $K_n$ in precoder 400A. Such limiting may lead to certain points falling outside of the allowed levels, however in return for the points falling outside of the allowed levels, the number of levels presented to the receiver can be limited. This form of THP is referred to as Dynamics Limited Precoding (DLP).

Precoding has several advantages over receiver side equalization. One advantage is that a precoder lends itself to a better parallel implementation than receive side equalization such as Decision Feedback Equalization (DFE). Another advantage of receiver side equalization is that when using trellis-coded modulation, precoding allows the trellis decoder to be substantially simplified, since the decoder then does not have to deal with intersymbol interference. The combination of precoding with trellis coded modulation can approach the Shannon bound for channel capacity when good modulation codes are used. Therefore, the present architecture can provide a close to optimal architecture.

Figure 5:
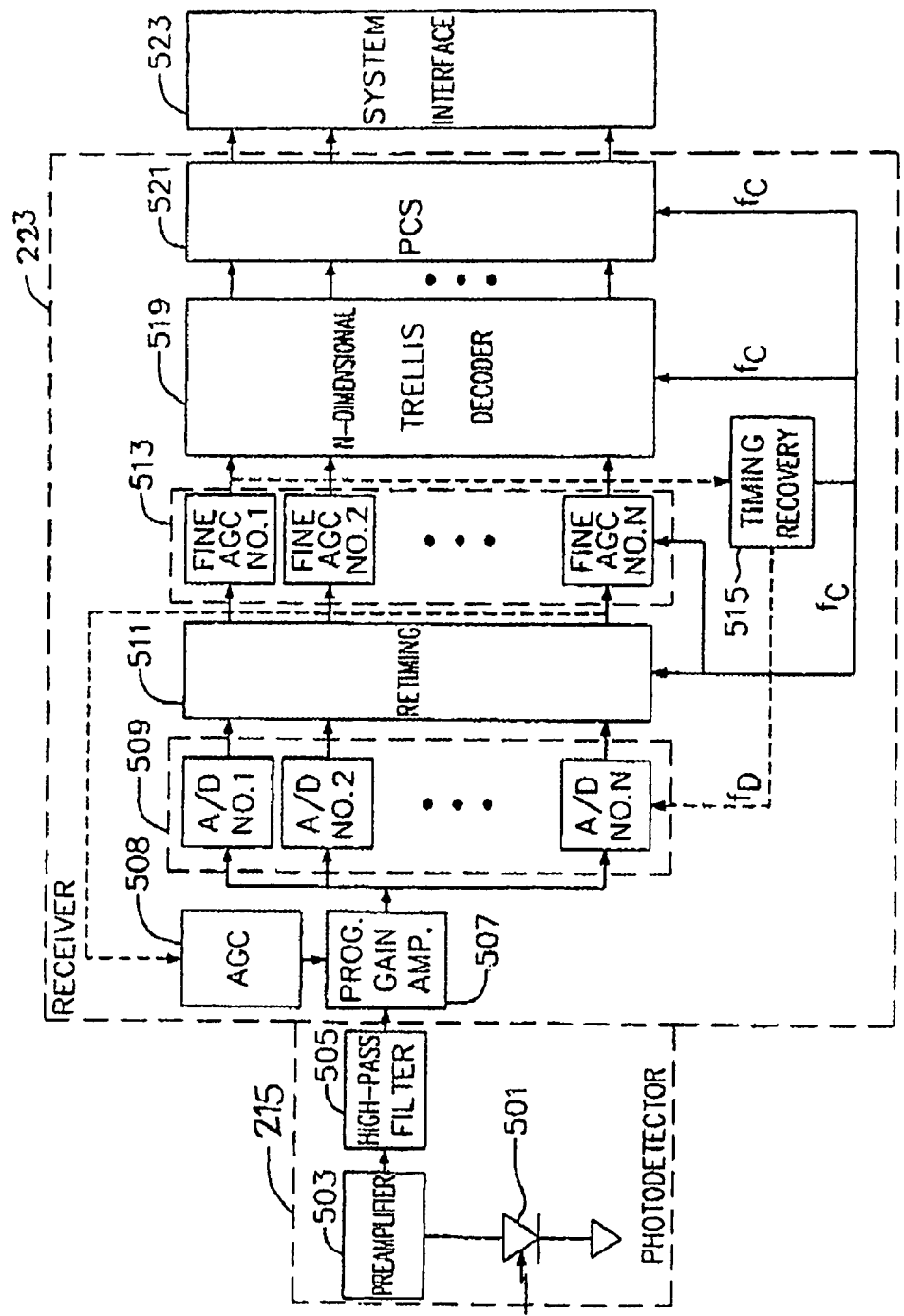
FIG. 5 is a block diagram of a receiver, according to an embodiment of the invention.

FIG. 5 is a block diagram of a receiver, according to an embodiment of the invention, illustrating the decoding of multiple signals transmitted across the same channel. In FIG. 5, a photo detector 501 accepts a pulse amplitude modulated signal from the fiber optic channel 213. The photo detector 501 then provides a voltage signal, representative of the signal received from the fiber optic channel 213, to a preamplifier 503. The pre-amplifier 503 amplifies the signal provided by the photo detector 501 to a suitable level. Pre-amplifier 503 then provides the amplified signal to a high pass filter 505.

High pass filter 505 functions to prevent a phenomenon known as baseline wander. High pass filtering the input signal blocks low frequencies thus minimizing low frequency excursions. Photo detector 501, pre-amplifier 503 and high pass filter 505 generally define the optical-to-electrical converter 215. The boundaries, however, between the optical-to-electrical converter and decoder are somewhat arbitrary and other sources may define the boundary line between these blocks differently.

The output of high pass filter 505 is provided to a programmable gain amplifier (PGA) 507. The gain of the PGA 507 is controlled by an automatic gain control (AGC) circuit 508. AGC circuit 508 controls the gain of the amplifier 507 according to signal levels at the output of the retiming block 511. The signal at the output of the PGA 507 comprises a series of high speed pulse amplitude modulated voltage signals. The output of the programmable gain amplifier 507 is coupled into a plurality of interleaved analog to digital converters 509.

The analog to digital converters (A/D) 509 are timed by a clock provided by the timing recovery circuit 515. Each A/D converter, however, receives its own phase of the clock in order to sample successive values using successive A/D converters. Because the values received by the A/D converters are sampled using a clock having different phases, retiming of the signals is necessary in order to create a synchronized parallel value. The retiming of the A/D samples takes place in retiming block 511. Retiming block 511 essentially comprises a clocked register circuit or equivalent. By interleaving N A/D converters in the analog to digital block 509, the clock rate of each individual converter can be reduced by a factor of N (over the use of a single converter). Without the interleaving of analog to digital converters 509 it may be difficult or impossible to fabricate an analog to digital converter, which could sample the input at a high enough rate, in order not to lose any successive values in the input data stream. By interleaving the A/D converters the necessity of using very high speed circuit technologies, such as gallium arsenide or indium phosphide may be avoided.

Parallel values from the retiming block 511 are provided to a fine AGC module 513. The digital values of the synchronized parallel data can be examined in the fine AGC modules to determine whether the amplitude of the input signal is correct and to provide fine adjustments to the signal values. The timing recovery block 515 may adjust the timing of the analog to digital converters.

The output of the fine AGC block 513 is coupled into K-way interleaved L-dimensional trellis decoder. The number K of trellis decoders will vary depending on a variety of implementation details. The N-dimensional trellis decoder 519 decodes the symbols accepted from the fine AGC module 513 and converts them into digital data values.

Once the PAM-5 symbols have been decoded into bit patterns, they are provided to a physical coding sublayer (PCS) 521. The physical coding sublayer 521 provides bit manipulation, such as signal descrambling, etc. The physical coding sublayer 521 then provides a resultant bit stream to a system interface 523.

Figure 6:
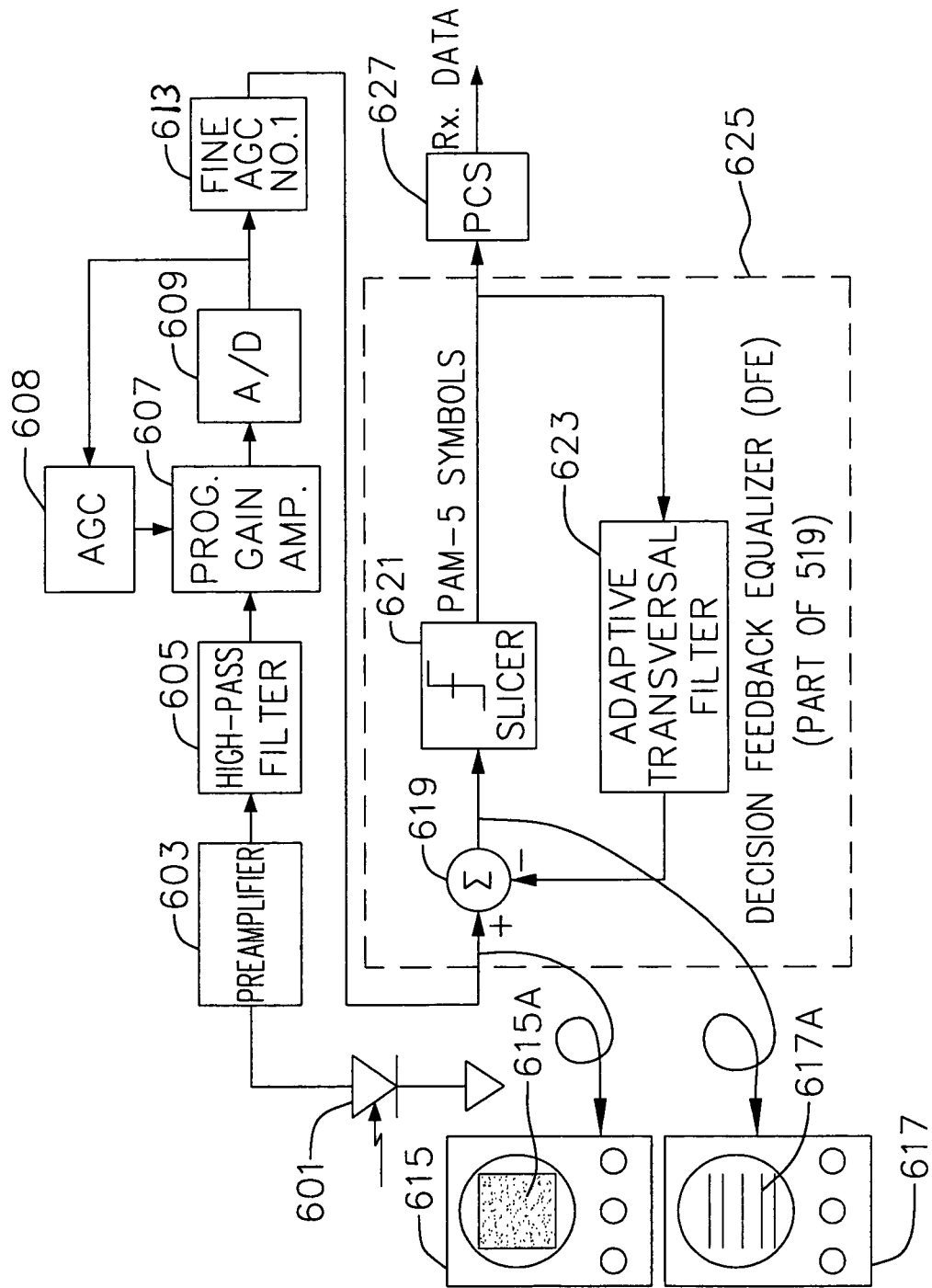
FIG. 6 is a simplified block diagram of a receiver, which contains a decision feedback equalizer (DFE).

FIG. 6 is a simplified block diagram of a receiver such as that illustrated in FIG. 5 illustrating the addition of a DFE. The DFE in the receiver may be used instead of a Tomlinson precoder in the transmitter. Because equalization can be done equivalently in the receiver or transmitter the net equalization effect is the same.

The block diagram of FIG. 6 does not illustrate the parallelism of the receiver illustrated by FIG. 5. FIG. 6, however does provide detail on the addition of equalization, which may be included in the receiver. A photonic signal is accepted by the detector 601. The detector 601 converts the received signal into a voltage and then provides the voltage signal to pre-amplifier 603. Pre-amplifier 603 amplifies the signal and provides it to high pass filter 605. A programmable gain amplifier 607 accepts the signal from the high pass filter 605 and provides it to an A/D converter 609.

The A/D converter 609 converts the analog signal from the high pass filter into a digital equivalent. An AGC block 608 accepts the digital value from the A/D converter 609 and controls the gain of the programmable gain amplifier (PGA) 607. The output of the analog to digital converter 609 is also provided to a fine AGC 613, where small adjustments in the signal are made. The output of the fine AGC 613 is then provided to a decision feedback equalizer 625. In order to explain the operation of a decision feedback equalizer reference will be made to FIG. 7.

Figure 7:
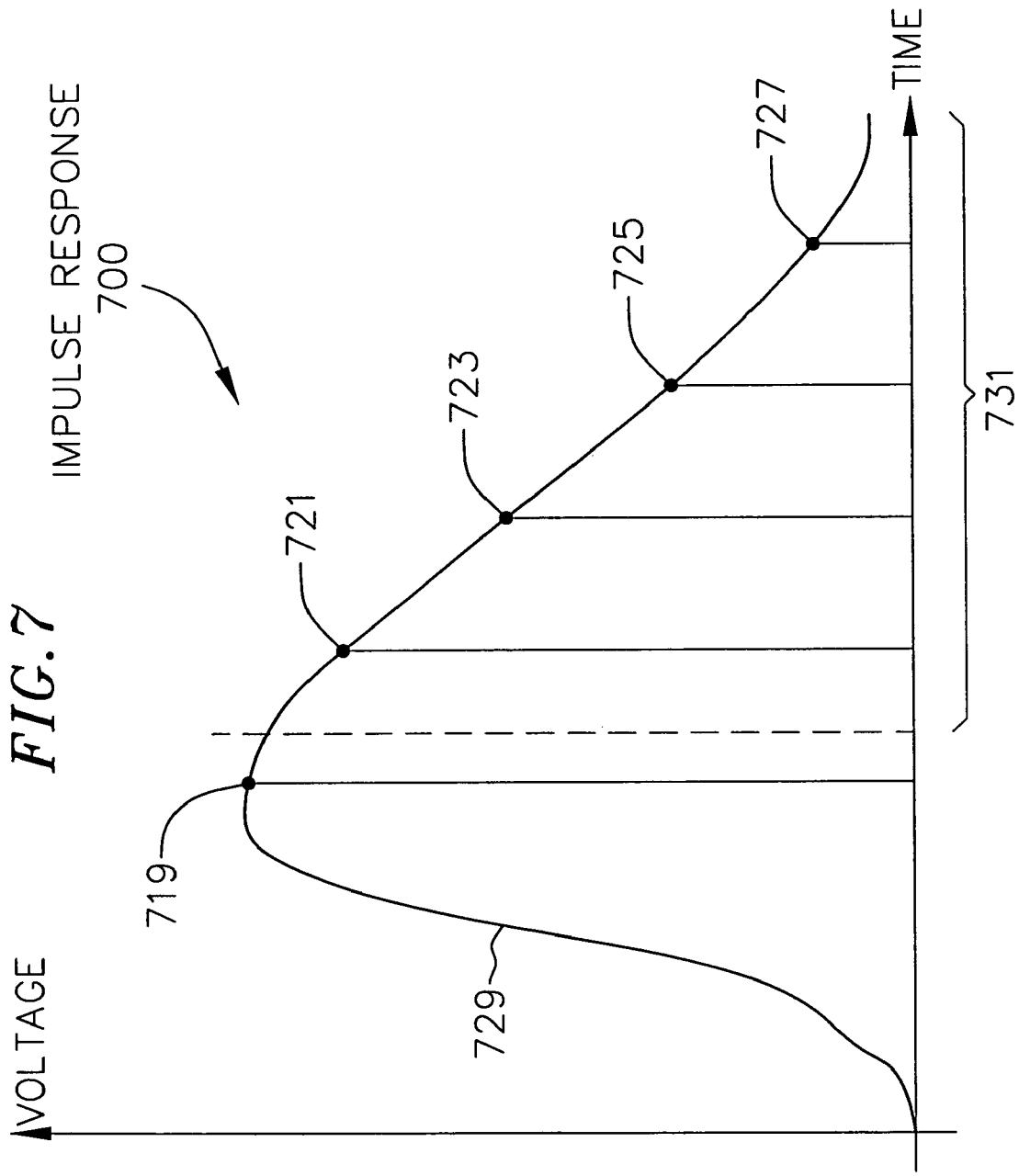
FIG. 7 is a graphical illustration of the impulse response of an exemplary fiber channel.

FIG. 7 is a graphical illustration of the impulse response of an exemplary fiber channel. In FIG. 7, point 719 represents a decision point where the value of the waveform 729 is sampled. Since the input waveform is an impulse, by definition only one value (represented by point 719) is provided to the channel. Therefore any subsequent response such as values 721, 723, 725 or 727 do not represent valid values which have been provided to the channel. Values 721, 723, 725 and 727 instead represent intersymbol interference caused by the impulse function. Samples 721, 723, 725 and 727 may be caused by the dispersion of the impulse waveform within a multimode fiber and are an undesirable feature of the fiber channel. They are generally caused by the differing propagation times of the impulse through different modes of the fiber. An equalizer, such as the illustrated DFE 625 may compensate for the distortion introduced by samples such as 721, 723, 725 and 727. The decision feedback equalizer uses an adaptive transversal filter 623 to generate a waveform equivalent to the trailing edge 731 of the impulse response. The trailing edge, represented by 731, is the portion of the waveform immediately after the sampled point 719 which includes spurious response points 721, 723, 725 and 727. The portion 731 of the waveform represents the spurious response of the channel. The adaptive transversal filter 623 makes a copy of the spurious response and subtracts it from the overall channel response in summation unit 619. The adaptive transversal filter is termed adaptive because it must adapt itself to the characteristics of the channel.

In other words, the adaptive transversal filter must be trained using the channel characteristics in order to derive the proper response that will be provided to the summation unit 619. Once the slicer 621 detects which symbol is present, the adaptive transversal filter can then provide the response necessary to cancel the intersymbol interference present that would accompany the transmitted point.

The received waveform at a point prior to the summation unit 619 is shown on oscilloscope 615 as display 615A. Display 615A is a scatter type waveform that does not exhibit distinct levels. The waveform 731 may be generated by the adaptive transversal filter 623, in order to cancel the intersymbol interference (ISI) within the channel.

Once the intersymbol interference is subtracted from the incoming signal in summation unit 619, the output of the summation unit appears as shown on oscilloscope 617, in display 617A. Display 617A represents an eye diagram having five discrete levels. Once the levels have been well defined, as seen on display 617A, the slicer 621 is able to distinguish relatively easily between the symbols. The adaptive transversal filter 623 will respond to whatever symbol is found by the slicer 623 and provide the necessary waveform to cancel the intersymbol interference caused by the found symbol's transmission. The transversal filter generates an intersymbol interference replica, which must be subtracted from the incoming signal. The intersymbol interference waveform changes, depending on which symbol has been found by the slicer. The output of the decision feedback equalizer depends on the previously decoded symbols. The PAM-5 symbols found are then decoded by the Physical Coding Sublayer (PCS) 627 and then provided to an interface such as a XGMII interface (not shown).

To further set forth the inventive concepts, a preliminary simulation study of a PAM-5 system is discussed. To simulate the PAM-5 system a laser model was created using rate equations. Pseudo-random PAM-5 data was introduced to the laser model. The output from the laser model was provided to fiber model. The fiber modeled was a multimode type fiber modeled as a linear system with Gaussian Impulse Response. In one example a 62.5/125 μm fiber having a bandwidth of 1 GHZ conveys a loss nanometer signal.

The Nyquist theorem establishes that the bandwidth needed to transmit data at a rate $F_b=1/T$, without intersymbol interference, must be larger than or equal to ½ T. Many communication systems however, signal at rates faster than 0.5 $F_b$, using special techniques to control the intersymbol interference. Such techniques have been used in the 100Base-TX and 1000Base-T Ethernet transceivers. The present model examines signaling at 5 GBaud over multimode fibers with 1 GHZ bandwidth. The present simulations contemplate signaling at 2.5 times the Nyquist rate (data rate equals 10 Gb/s, baud rate $F_b=5$ GHZ, bandwidth equals 1 GHZ). This bandwidth assumption is consistent with 500 meters of 160/500 MHz-KM fiber at 1350 nanometers (nm), or 160 meters of the same fiber at 850 nm.

The model also assumes a receiver having a DFE as illustrated in FIG. 6. It is recognized that equivalent equalization can be accomplished at the transmitter through the use of THP, DLP or other equalization techniques.

The rate equations used in modeling the laser are described in "On Approximate Analytical Solutions of the Rate Equations for Studying Transient Spectra of Injection Lasers", by D. Marcuse and T. P. Lee, IEEE Journal of Quantrum Electronics, September 1983. The equations of the computer model are solved numerically using a fourth order Runge-Kutta Algorithm. The bias current in the equations was set to three times $I_{threshold}$. In addition, a 6dB extinction ratio is used.

Figure 8:
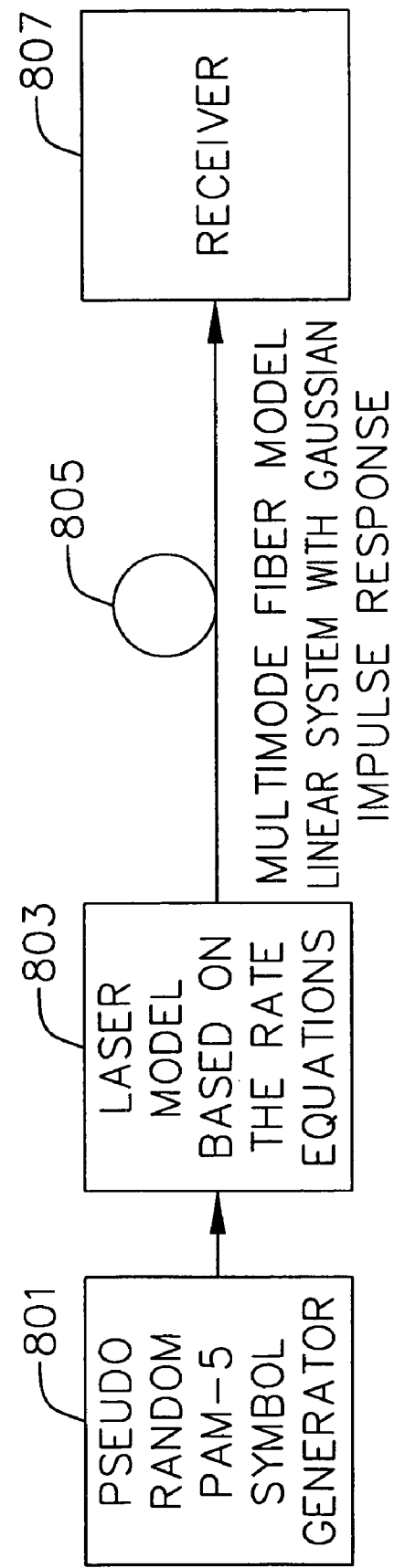
FIG. 8 is a block diagram illustrating a fiber channel model used in conjunction with a laser model based on the rate equations.

FIG. 8 is a block diagram illustrating a channel model used in conjunction with the rate equations. In FIG. 8, a pseudo-random PAM-5 symbol generator 801 provides symbols to the laser model 803. The output of the laser model is then provided to a multimode fiber model 805. The fiber model 805 is a linear system having a Gaussian impulse response.

FIG. 9 is a graphic representing the impulse response of a linear system having a Gaussian impulse response convolved with a single pole high pass filter with corner frequency of 200 MHz. For the simulation, the fiber channel is modeled as in an article "Equalization of Multimode Optical Fiber Systems," by B. L. Kaspers, Bell Systems Technical Journal, September 1982. The Kaspers' model comprises a linear dispersive system with a Gaussian impulse response given by equation 1. Such Gaussian impulse response models are common throughout the literature and are considered to be fairly accurate for fibers in which all modes are excited equally (i.e. multimode fibers in an overfill launch condition).

$$h(t) = \frac{1}{\sqrt{2\pi} \cdot \alpha T} \cdot e^{-[t^2/(2(\alpha T)^2)]} \quad \text{(Equation 1)}$$

Where T is the period and a is a system dependent variable related to the bandwidth of the fiber. The corresponding frequency response of the channel is given by equation 2.

$$H(f) = e^{-[(2\pi\alpha Tf)^2/2]} \quad \text{(Equation 2)}$$

The 3 dB bandwidth of the fiber is given by a equation 8 for a given baud period equal to 300 pico seconds.

$$f_{3dB} = \frac{0.1325}{\alpha T} \quad \text{(Equation 3)}$$

If the 3 dB bandwidth of the system is assumed to be one gigahertz, the value of ∞ is equal to 0.6625.

Figure 10:
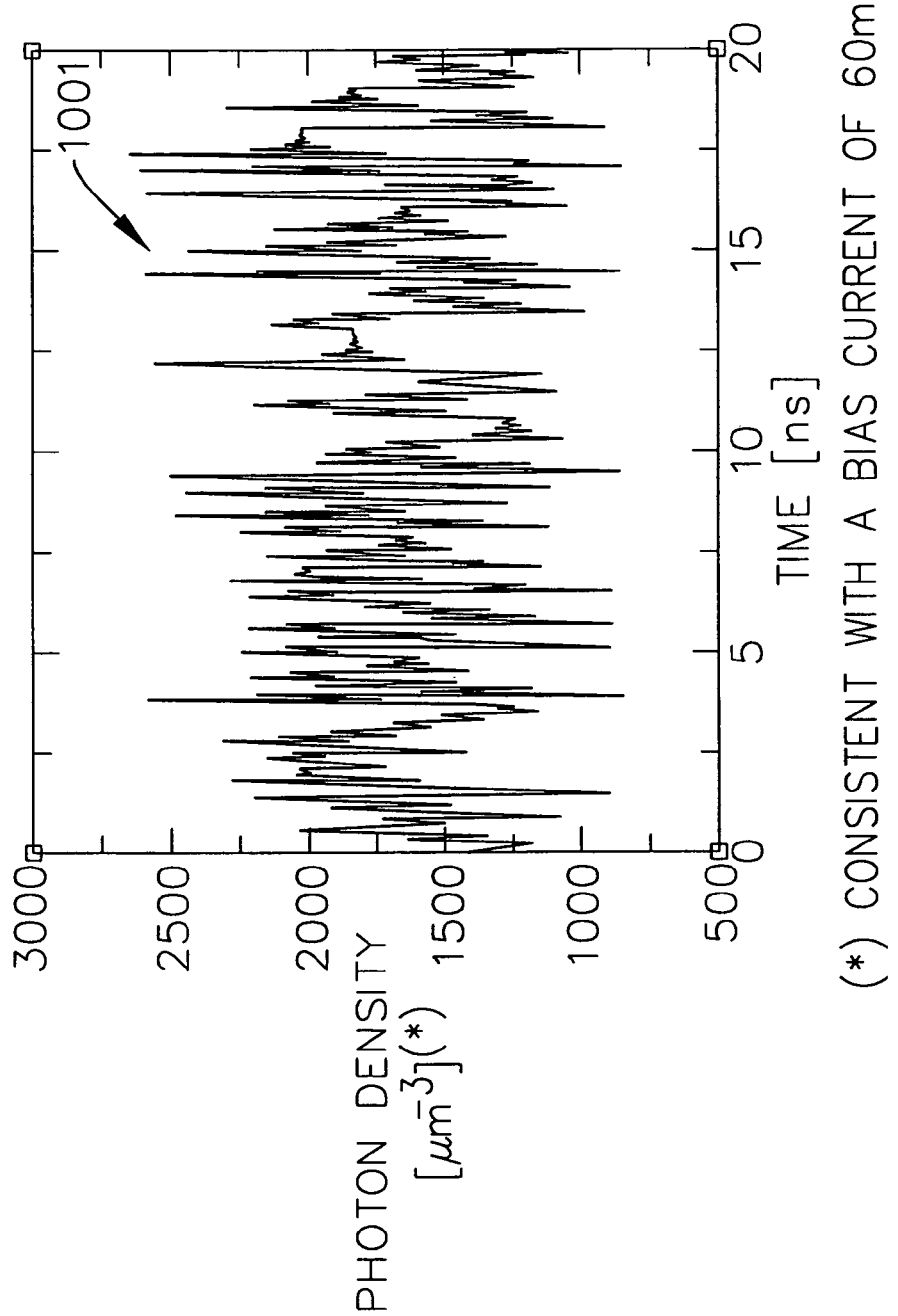
FIG. 10 is a graph illustrating an output of a laser model based on the rate equations.

FIG. 10 is a graph illustrating the output of a laser model based on the rate equations. The vertical axis 1001 represents the intensity of the laser.

As can be seen from FIG. 10, the signal appears to be somewhat noisy. The noise is partially accounted for by relaxation oscillation of the laser. Each time there is a sharp transition in the laser signal, overshoot and ringing results, as depicted in the graph of FIG. 10.

Figure 11:
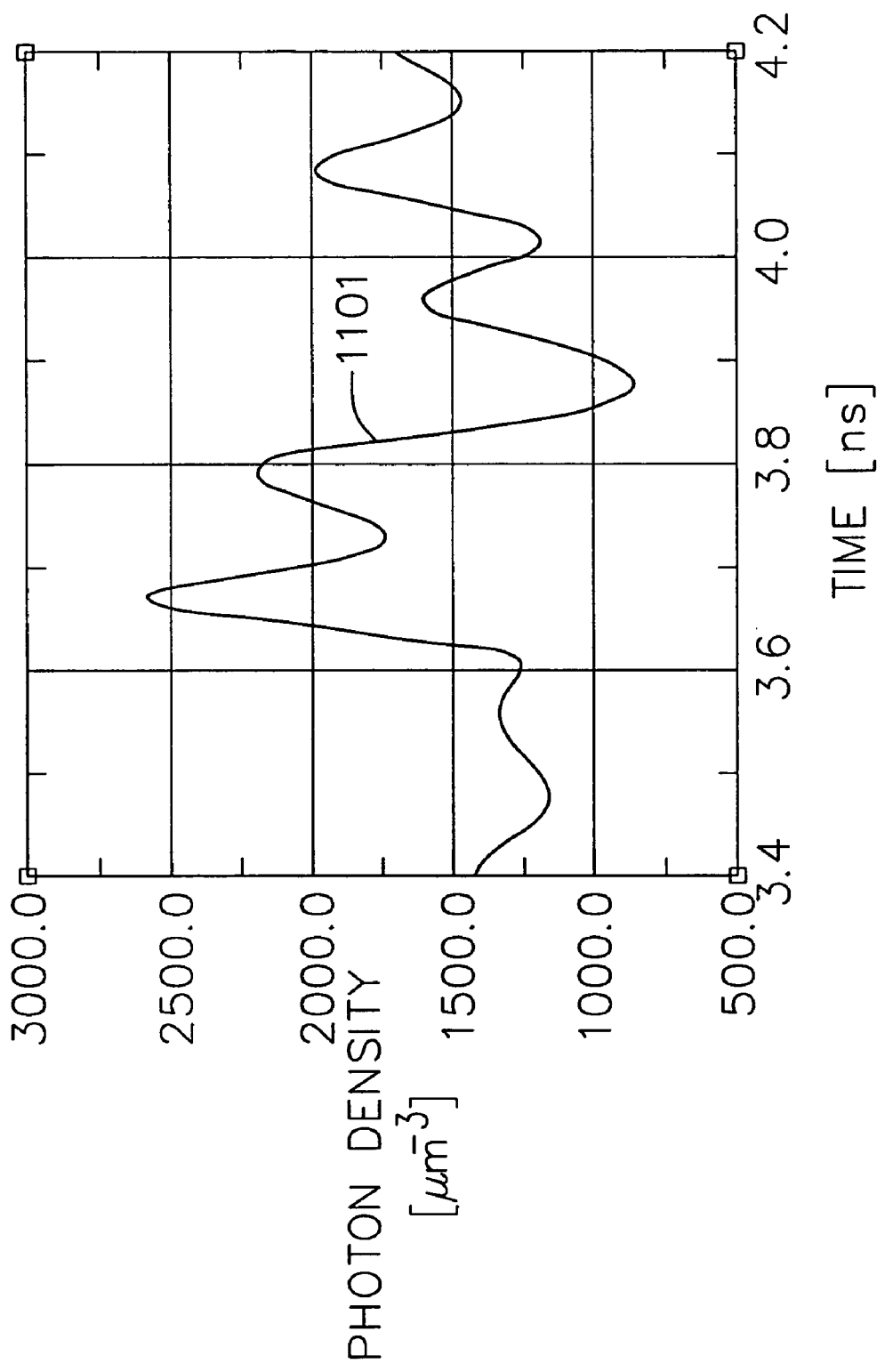
FIG. 11 is a graph illustrating an expanded portion of the graph illustrated in FIG. 11.

FIG. 11 is a magnified portion of the graph of FIG. 10. FIG. 11 is included to illustrate the ringing present within the waveform of FIG. 10.

Figure 12:
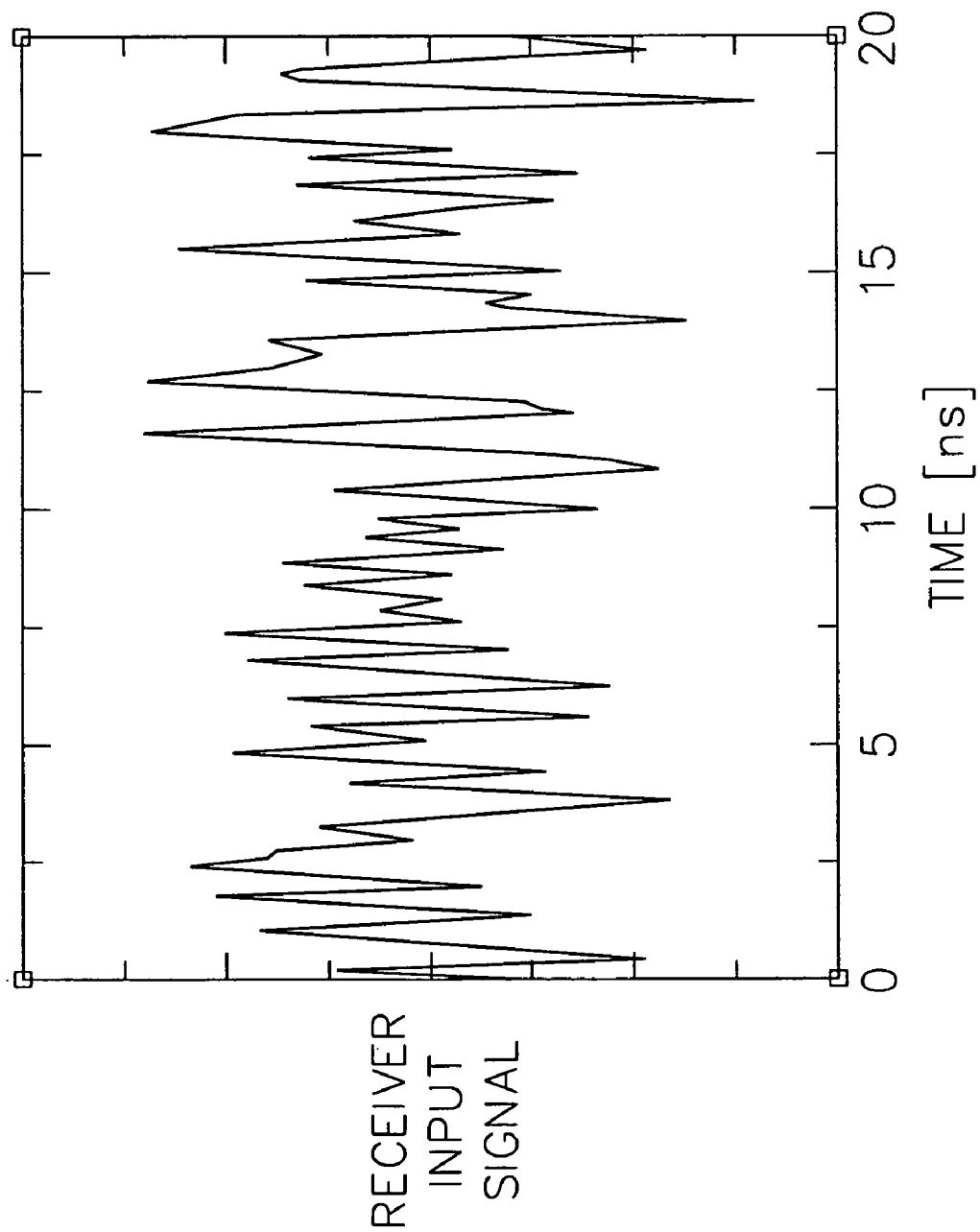
FIG. 12 is a graph of the simulated output of the laser model of FIG. 10 after passage through a simulated channel.

FIG. 12 is a graph of the waveform of FIG. 10 after passage through the fiber channel model. In other words, FIG. 12 is an illustration of the waveform presented to the receiver. As can be readily appreciated by observing FIGS. 10 and 12, the fiber channel performs significant filtering on the output of the laser. In other words, FIG. 12 is a convolution of the waveform in FIG. 10 with the impulse response of the channel as illustrated in FIG. 9.

FIG. 13 is an eye diagram of a simulated equalizer at the transition between a training mode and receiving PAM-5 symbols.

The simulated signal of FIG. 12 is introduced to a receiver in FIG. 13. The receiver used is one such as illustrated in FIG. 6. The eye diagram depicted in FIG. 13 is the output of the decision feedback equalizer 625 of FIG. 6. The portion of the graph in FIG. 13 delineated by 1301 represents a scatter diagram equivalent to the display 615(a) of FIG. 6. The scatter diagram results after data has begun entering the receiver and being processed by the slicer but the equalizer has not yet been trained. In other words, the adaptive transversal filter has not yet adapted to the characteristics of the channel. A portion of the graph illustrated at 1303 in FIG. 13 is an illustration of the equalizer being trained using two level symbols. At point 1315, within FIG. 13, the five level Pam alphabet is transmitted to the receiver. The results of the receiving of the five level Pam-5 alphabet in the trained decision feedback equalizer 625 is the five levels 1305,1307,1309,1311, and 1313 depicted in FIG. 13.

FIG. 14 is a graph of a magnified portion of the graph of FIG. 13, illustrating the convergence of the equalizer during a training sequence.

FIG. 14 is a time expansion of the section 1301 of FIG. 13. As can be seen from FIGS. 13 and 14, high data rates can be achieved using pulse amplitude modulation despite the presence of inner symbol interference, which may result from signaling faster than the Nyquist rate.

As can be seen from the models used to simulate the PAM-5 system transmitting data a faster than the Nyquist rate is viable using the techniques disclosed. Additionally using multilevel symbols has been shown to be viable and may be used to increase the data rate across fiber channels. The reduced noise tolerance of the system due to the reduced distance between signaling levels of a multilevel signaling system may be counteracted by the use of trellis coding the signals transmitted.

Supplemental material with regard to the invention here and above described in Appendix A entitled "10 Gb/s PMD Using PAM-5 Trellis Coded Modulation".

What is claimed is:

1. A method of transmitting data on an optical channel, the method comprising:
   encoding information via a trellis encoder;
   mapping the encoded information into digital multilevel symbols, wherein the digital multilevel symbols are part of a pulse amplitude modulation (PAM) alphabet comprising at least three symbols;
   converting the digital multilevel symbols into analog multilevel signals; and
   modulating the intensity of a transmitting light source according to the level of the analog multilevel signals.

2. The method of claim 1 wherein the information that is encoded comprises input bits and wherein encoding the information includes mapping the input bits into digital multilevel symbols.

3. The method of claim 1 wherein transmitting the analog multilevel signals over an optical channel comprises modulating the intensity of a light source according to the level of the analog multilevel signals.

4. The method of claim 1 wherein transmitting the analog multilevel signals over an optical channel comprises modulating laser intensity according to the level of the analog multilevel signals.

5. The method of claim 1 further comprising equalizing the digital multilevel symbols to compensate for characteristics of the optical channel.

6. The method of claim 5 wherein equalizing the digital multilevel symbols comprises preceding the digital multilevel symbols using a Tomlinson-Harashima precoder.

7. The method of claim 5 wherein equalizing the digital multilevel symbols comprises precoding the digital multilevel symbols using a dynamic limiting precoder.

8. A method as in claim 5 wherein equalizing the digital multilevel symbols to compensate for the channel characteristics comprises:
   characterizing the channel; and
   applying an inverse characterization of the channel to the digital multilevel symbols.

9. The method of claim 1 further comprising equalizing the multilevel symbols to compensate for characteristics of the optical channel.

10. The method of claim 1 wherein the digital multilevel symbols are part of a pulse amplitude modulation (PAM) alphabet comprising at least five symbols.

11. The method of claim 10 wherein the digital multilevel symbols are part of a PAM-5 alphabet having five symbols.

12. A method of transmitting data on an optical channel, the method comprising:
   accepting information from a plurality of sources;
   encoding the information via a plurality of trellis encoders;
   mapping the encoded information into a plurality digital multilevel symbols via a plurality of symbol mappers, wherein the digital multilevel symbols are part of a pulse amplitude modulation (PAM) alphabet comprising at least three symbols;
   converting the plurality of digital multilevel symbols into a plurality of analog multilevel signals;
   time division multiplexing the plurality of analog multilevel signals; and
   modulating the intensity of a transmitting light source according to the level of the multiplexed analog multilevel signals.

13. A method as in claim 12 wherein the accepted information comprises input bits and wherein encoding the information comprises:
mapping the input bits into digital multilevel symbols.

14. The method of claim 12 wherein transmitting the analog multilevel signals over an optical channel comprises modulating the intensity of a light source according to the level of the analog multilevel signals.

15. The method of claim 12 wherein transmitting the analog multilevel signals over an optical channel comprises modulating laser intensity according to the level of the analog multilevel signals.

16. The method of claim 12 wherein converting the plurality of digital multilevel symbols into a plurality of analog multilevel signals comprises:
accepting the plurality of multilevel symbols successively into a single analog to digital converter; and
successively converting the plurality of symbols into analog multilevel signals.

17. The method of claim 12 wherein converting the plurality of digital multilevel symbols into a plurality of analog multilevel signals comprises:
accepting the plurality of multilevel symbols successively into a plurality of analog to digital converters; and
converting the plurality of symbols into an analog representation; and
successively combining the analog multilevel signals into a succession of analog multilevel signals.

18. The method of claim 12 further comprising equalizing the plurality of digital multilevel symbols to compensate for characteristics of the optical channel.

19. The method of claim 18 wherein equalizing the digital multilevel symbols comprises precoding the digital multilevel symbols using a dynamic limiting precoder.

20. The method of claim 18 wherein equalizing the digital multilevel symbols to compensate for the laser and channel characteristics comprises:
characterizing the channel; and
using an inverse characterization of the channel to modify the digital multilevel symbols.

21. The method of claim 18 wherein equalizing the digital multilevel symbols comprises preceding the plurality of digital multilevel symbols using a Tomlinson-Harashima precoder.

22. The method of claim 12 further comprising equalizing the plurality of multilevel symbols to compensate for characteristics of the optical channel.

23. The method of claim 12 wherein the digital multilevel symbols are part of a pulse amplitude modulation (PAM) alphabet comprising at least five symbols.

24. The method of claim 23 wherein the digital multilevel symbols are part of a PAM-5 alphabet having five symbols.

25. An apparatus for transmitting information on an optical channel, the apparatus comprising:
a trellis encoder for accepting and encoding digital information;
a symbol mapper that maps the encoded information into digital multilevel signals, wherein the digital multilevel signals represent symbols that are part of a pulse amplitude modulation (PAM) alphabet comprising at least three symbols;
a digital-to-analog converter that accepts the digital multilevel signals and produces analog multilevel signals; and
an analog signal to optical converter that modulates the intensity of a transmitting light source according to the level of the analog multilevel signals.

26. An apparatus as in claim 25 wherein the analog signal to optical converter includes a laser.

27. The apparatus of claim 25 further comprising an equalizer that accepts the digital multilevel signals and produces equalized digital multilevel signals prior to coupling into the digital-to-analog converter.

28. An apparatus as in claim 27 wherein the equalizer is a dynamic limiting precoder.

29. An apparatus as in claim 27 wherein the equalizer is a Tomlinson-Harashima precoder.

30. The apparatus of claim 25 further comprising an equalizer that accepts the multilevel signals and produces equalized multilevel signals.

31. The apparatus of claim 25 wherein the digital multilevel signals represent symbols that are part of a pulse amplitude modulation (PAM) alphabet comprising at least five symbols.

32. The apparatus of claim 31 wherein the digital multilevel signals represent symbols that are part of a PAM-5 alphabet having five symbols.

33. An apparatus for concurrently transmitting a plurality of data signals over an optical channel, the apparatus comprising:
a plurality of trellis encoders that accept and encode a plurality of data signals;
a plurality of symbol mappers that map the plurality of encoded data signals into a plurality of digital multilevel signals, wherein the digital multilevel signals represent symbols that are part of a pulse amplitude modulation (PAM) alphabet comprising at least three symbols;
a converter that accepts the plurality of digital multilevel signals and produces a plurality of analog multilevel signals; and
an optical source that receives the plurality of analog multilevel signals and produces a light output proportional to the level of successive analog multilevel signals for driving an optical channel.

34. An apparatus as in claim 33 further comprising a plurality of equalizers that accept the plurality of digital multilevel signals and produce a plurality of equalized digital multilevel signals to provide to the converter.

35. An apparatus as in claim 34 wherein the plurality of equalizers comprise a plurality of Tomlinson-Harashima precoders.

36. An apparatus as in claim 34 wherein the plurality of equalizers comprise at least one dynamic limiting precoder.

37. The apparatus of claim 33 wherein the digital multilevel signals represent symbols that are part of a pulse amplitude modulation (PAM) alphabet comprising at least five symbols.

38. The apparatus of claim 37 wherein the digital multilevel signals represent symbols that are part of a PAM-5 alphabet having five symbols.

39. An apparatus for concurrently transmitting a plurality of data signals over an optical channel, the apparatus comprising:
a plurality of trellis encoders that accept and encode a plurality of data signals;
a plurality of symbol mappers that map the plurality of encoded data signals into a plurality of digital multilevel signals, wherein the digital multilevel signals represent symbols that are part of a pulse amplitude modulation (PAM) alphabet comprising at least three symbols;
a digital-to-analog converter that sequentially accepts the plurality of digital multilevel signals and produces a plurality of sequential analog multilevel signals; and an optical source that receives the plurality of analog multilevel signals, wherein the intensity of the optical source is modulated according to the level of the analog multilevel signals.

40. An apparatus as in claim 39 further comprising a plurality of equalizers that accept the plurality of digital multilevel signals and produce a plurality of digital multilevel signals.

41. An apparatus as in claim 40 wherein the plurality of equalizers comprise at least one dynamic limiting precoder.

42. An apparatus as in claim 40 wherein the plurality of equalizers comprise a plurality of Tomlinson-Harashima precoders.

43. The apparatus of claim 39 wherein the digital multilevel signals represent symbols that are part of a pulse amplitude modulation (PAM) alphabet comprising at least five symbols.

44. The apparatus of claim 43 wherein the digital multilevel signals represent symbols that are part of a PAM-5 alphabet having five symbols.

45. A method of signaling over an optical channel, the method comprising:
accepting data from a source;
mapping the data into multilevel symbols according to a pulse, amplitude modulation (PAM) scheme that employs at least three symbols that correspond to different signal levels;
transmitting the data on an optical channel by modulating the intensity of a light source according to the level of the multilevel symbols;
conveying the multilevel-modulated data over the optical channel;
accepting multilevel-modulated data from the optical channel;
demodulating the multilevel-modulated data accepted from the optical channel; and
providing the demodulated data to an interface.

46. A method as in claim 45 further comprising equalizing the data after multilevel modulating the data.

47. A method as in claim 46 wherein equalizing the data comprises applying a Tomlinson-Harashima precoding to the data.

48. A method as in claim 46 wherein equalizing the data comprises applying a dynamic limiting precoding.

49. The method of claim 45 wherein the data is mapped into multilevel symbols according to a pulse amplitude modulation (PAM) scheme that employs at least five symbols that correspond to different signal levels.

50. The method of claim 49 wherein the data is mapped into multilevel symbols according to a pulse PAM-5 scheme that employs five symbols that correspond to different signal levels.

51. A method of signaling over an optical channel, the method comprising:
accepting data from a source;
mapping the data into multilevel symbols according to a pulse amplitude modulation (PAM) scheme that employs at least three symbols that correspond to different signal levels;
transmitting the data on an optical channel by modulating the intensity of a light source according to the level of the multilevel symbols;
conveying the multilevel-modulated data over the optical channel;
accepting multilevel-modulated data from the optical channel;
converting the multilevel-modulated data accepted from the optical channel to multilevel-modulated digital data;
demodulating the multilevel-modulated digital data accepted from the optical channel; and
providing the demodulated data to an interface.

52. A method as in claim 51 further comprising equalizing the data after multilevel modulating the data.

53. A method as in claim 52 wherein equalizing the data comprises applying a Tomlinson-Harashima precoding to the data.

54. A method as in claim 52 wherein equalizing the data comprises applying a dynamic limiting precoding.

55. The method of claim 51 wherein the data is mapped into multilevel symbols according to a pulse amplitude modulation (PAM) scheme that employs at least five symbols that correspond to different signal levels.

56. The method of claim 55 wherein the data is mapped into multilevel symbols according to a pulse PAM-5 scheme that employs five symbols that correspond to different signal levels.

57. An apparatus for concurrently transmitting a plurality of data signals over an optical channel, the apparatus comprising:
a plurality of pulse amplitude modulators that accept a plurality of data signals and produce a plurality of digital multilevel signals using a pulse amplitude modulation (PAM) scheme that employs at least three symbols that correspond to different signal levels;
a converter that accepts the plurality of digital multilevel signals and produces a plurality of analog multilevel signals; and
an optical source that receives the plurality of analog multilevel signals and produces a light output proportional to the level of successive analog multilevel signals for driving an optical channel.

58. The apparatus of claim 57 wherein the plurality of pulse amplitude modulators use a pulse amplitude modulation (PAM) scheme that employs at least five symbols that correspond to different signal levels.

59. The apparatus of claim 58 wherein the plurality of pulse amplitude modulators use a PAM-5 scheme that employs five symbols that correspond to different signal levels.

60. An apparatus as in claim 57 further comprising a plurality of equalizers that accept the plurality of digital signals and produce a plurality of equalized digital signals to provide to the converter.

61. An apparatus as in claim 60 wherein the plurality of equalizers comprise a plurality of Tomlinson-Harashima precoders.

62. An apparatus as in claim 60 wherein the plurality of equalizers comprise at least one dynamic limiting precoder.

* * * * *